United States Patent
Park

(10) Patent No.: US 7,268,391 B2
(45) Date of Patent: Sep. 11, 2007

(54) SEMICONDUCTOR DEVICE HAVING AN UNDER STEPPED GATE FOR PREVENTING GATE FAILURE AND METHOD OF MANUFACTURING THE SAME

(75) Inventor: Seung Pyo Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 21 days.

(21) Appl. No.: 11/251,700

(22) Filed: Oct. 17, 2005

(65) Prior Publication Data
US 2007/0045723 A1 Mar. 1, 2007

(30) Foreign Application Priority Data
Aug. 30, 2005 (KR) .................. 10-2005-0079941

(51) Int. Cl.
*H01L 29/76* (2006.01)
(52) U.S. Cl. .................. 257/330; 257/334; 257/354; 257/29.201; 257/29.027
(58) Field of Classification Search ............. 257/330, 257/E29.201, E29.027, 334, 354
See application file for complete search history.

(56) References Cited

U.S. PATENT DOCUMENTS 7,102,187 B2 * 9/2006 Yoo .................. 257/296

2005/0093058 A1 * 5/2005 Park et al. .................. 257/324

FOREIGN PATENT DOCUMENTS

| JP | 59159658 | 9/1984 |
|---|---|---|
| JP | 61-036974 | 2/1986 |
| JP | 61036974 | 2/1986 |
| KR | 1019960005249 | 4/1996 |
| KR | 10 0250978 | 3/2000 |
| KR | 100259078 | 3/2000 |
| KR | 1020040002009 | 1/2004 |

OTHER PUBLICATIONS

Korean Patent Gazette, published Mar. 29, 2007.

* cited by examiner

*Primary Examiner*—Long K. Tran
(74) *Attorney, Agent, or Firm*—Ladas & Parry LLP

(57) ABSTRACT

A semiconductor device and a method of manufacturing the same capable of preventing a not open fail of a landing plug contact caused by the leaning of a gate. The method includes the steps of preparing a semiconductor substrate, forming first recesses by etching an active area of the semiconductor substrate, filling a conductive layer in the first recesses, forming a second recess by etching a predetermined part of the active area, forming under stepped gates, forming a gate insulating layer on a surface of the semiconductor substrate, forming a channel layer on the gate insulating layer, forming source/drain areas in the semiconductor substrate, forming an interlayer insulating film on an entire surface of the semiconductor substrate, and forming a landing plug in the interlayer insulating film such that the landing plug makes contact with the source/drain areas, respectively.

20 Claims, 4 Drawing Sheets

SEMICONDUCTOR DEVICE HAVING AN UNDER STEPPED GATE FOR PREVENTING GATE FAILURE AND METHOD OF MANUFACTURING THE SAME

BACKGROUND OF THE INVENTION

1. Field of the Invention

The present invention relates to a semiconductor device. More particularly, the present invention relates to a semiconductor device having an under stepped gate for preventing a "not open fail" of a landing plug contact by preventing a gate from leaning and a method of manufacturing the same.

2. Description of the Prior Art

Recently, as semiconductor memories, such as DRAMs, have been highly integrated, a conventional flat type transistor may cause lack of a threshold voltage in a cell area and reduction of refresh time. For this reason, various studies have been performed to ensure the threshold voltage and refresh characteristics adaptable for highly integrated semiconductor devices.

For instance, a STAR (step-gated asymmetry recess) cell structure has recently been proposed. As shown in FIG. 1, the STAR cell structure is achieved by recessing a part of an active area of a substrate 1 defined by an isolation layer 2. That is, the STAR cell structure is achieved by recessing both longitudinal edge portions of the active area such that the active area has a stepped structure and forming a gate 6 on the stepped portion of the active area to increase an effective channel length of a MOSFET device.

The STAR cell structure can reduce a short channel effect so that it can obtain a desired threshold voltage at a relatively low threshold voltage dose. In addition, the STAR cell structure can reduce an electric field applied to a MOSFET device, thereby lengthening the refresh time above three times as compared with that of the conventional flat type cell structure.

In particular, the STAR cell structure can be obtained by adding a simple process to conventional processes or changing the conventional processes, so that the STAR cell structure is easily applicable. For this reason, the STAR cell structure has recently been spotlighted as an effective solution for ensuring the threshold voltage and refresh characteristics adaptable for highly integrated semiconductor memory devices.

However, when fabricating the above STAR cell structure, as shown in FIG. 1, the gate 6 is formed on the stepped portion of the active area, causing the leaning of the gate 6.

If the gate 6 formed on the stepped portion of the active area leans, a contact part may not be exposed in the following landing plug contact (LPC) process, which is called an "LPC not open fail".

In FIG. 1, reference numerals 1 to 5 represent a semiconductor substrate, an isolation layer, a gate insulation layer, a gate conductive layer and a hard mask layer, respectively.

SUMMARY OF THE INVENTION

Accordingly, the present invention has been made to solve the above-mentioned problems occurring in the prior art, and an object of the present invention is to provide a semiconductor device capable of preventing a gate from leaning and a method of manufacturing the same.

Another object of the present invention is to provide a semiconductor device for preventing a "not open fail" of a landing plug contact (LPC) by preventing a gate from leaning and a method of manufacturing the same.

In order to accomplish the above objects, according to one aspect of the present invention, there is provided a semiconductor device comprising: a semiconductor substrate having an active area defined by an isolation layer and formed at a longitudinal center portion thereof with a recess; under stepped gates formed over both sidewalls of the recess, an upper surface of the semiconductor substrate adjacent to the recess and a predetermined inner portion of the semiconductor substrate formed below the upper surface of the semiconductor substrate; a gate insulating layer formed on the under stepped gates; a channel layer formed on the gate insulating layer provided at upper portions of the under stepped gates; source/drain areas formed in the semiconductor substrate corresponding to both sides of the under stepped gates; an interlayer insulating film formed on an entire surface of the semiconductor substrate including the channel layer; and a landing plug formed in the interlayer insulating film such that the landing plug makes contact with the source/drain areas, respectively.

According to the preferred embodiment of the present invention, the under stepped gates have "⌊" and "⌋" shapes, respectively and the channel layer includes a silicon epitaxial layer.

According to another aspect of the present invention, there is provided a method of manufacturing a semiconductor device, the method comprising the steps of: preparing a semiconductor substrate having an active area defined by an isolation layer; forming first recesses by etching a predetermined part of the active area where a gate is formed later; filling a conductive layer in the first recesses; forming a second recess by etching a predetermined part of the active area, where a drain area is formed later, and a predetermined portion of a polysilicon layer filled in the first recesses, and forming under stepped gates over both sidewalls of the second recess, an upper surface of the semiconductor substrate adjacent to the second recess and a predetermined inner portion of the semiconductor substrate formed below the upper surface of the semiconductor substrate; forming a gate insulating layer on a surface of the semiconductor substrate including the under stepped gates; forming a channel layer on the gate insulating layer provided at upper portions of the under stepped gates; forming source/drain areas in the semiconductor substrate corresponding to both sides of the under stepped gates; forming an interlayer insulating film on an entire surface of the semiconductor substrate including the channel layer; and forming a landing plug in the interlayer insulating film such that the landing plug makes contact with the source/drain areas, respectively.

The conductive layer includes a polysilicon layer.

The under stepped gates have "⌊" and "⌋" shapes, respectively.

The step of forming the channel layer includes the substeps of growing a silicon epitaxial layer on the gate insulating layer through a selective epitaxial growing process and etching the silicon epitaxial layer. At this time, the gate insulating layer remains on the source/drain areas when the silicon epitaxial layer has been etched and the gate insulating layer remaining on the source/drain areas is used as a buffer layer when an ion implantation process is performed to form the source/drain areas.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, the present invention will be described with reference to accompanying drawings.

FIGS. 2A to 2F are sectional views illustrating the procedure for manufacturing a semiconductor device according to one embodiment of the present invention.

Figure 1:
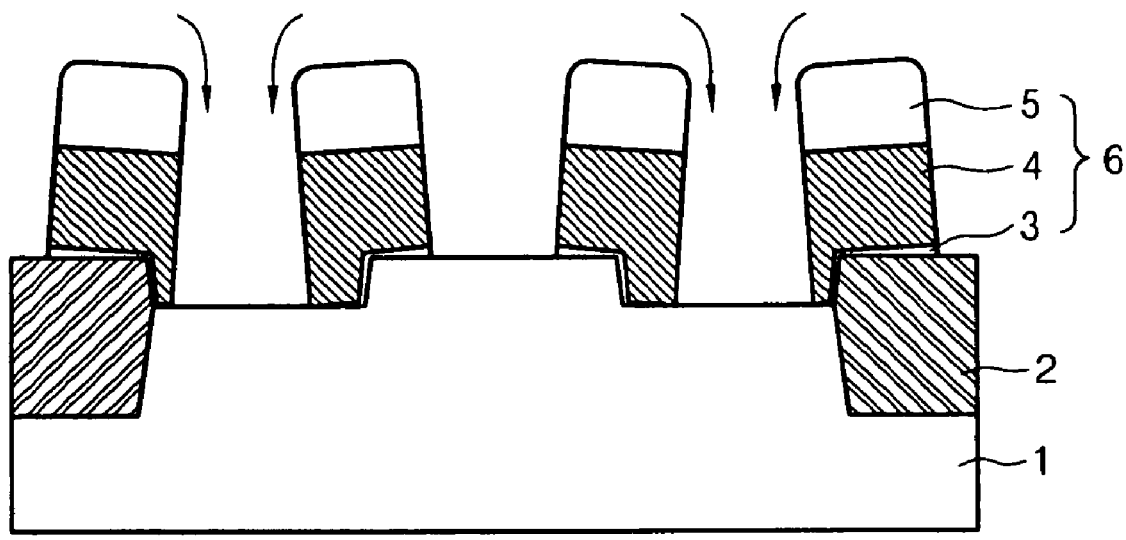
FIG. 1 is a sectional view illustrating a structure of a conventional STAR (Step-gated asymmetry recess) cell.
Figure 2A:
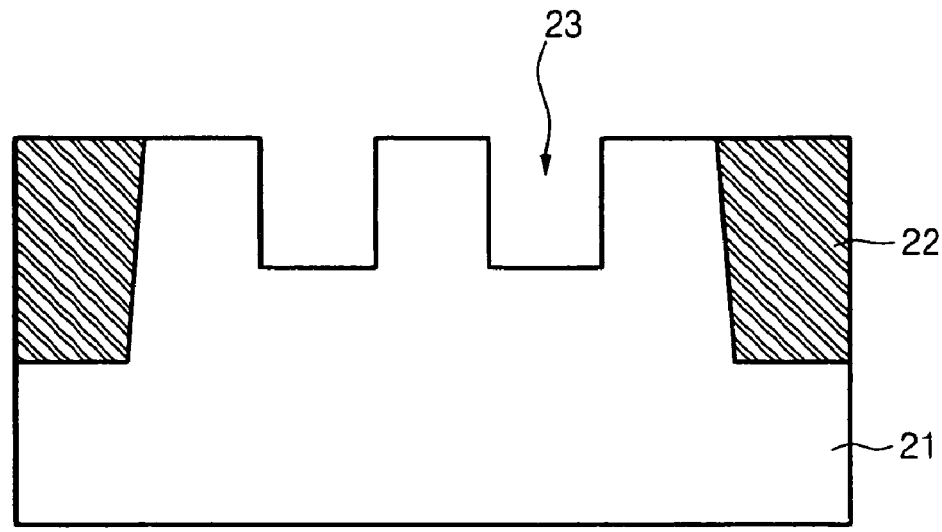
FIGS. 2A to 2F are sectional views illustrating the procedure for manufacturing a semiconductor device according to one embodiment of the present invention.

Referring to FIG. 2A, a semiconductor substrate 21 having a trench type isolation layer 22, which defines an active area and is formed through an STI (shallow trench isolation) process generally known in the art, is prepared. Then, a recess mask (not shown) for exposing gate parts of the active area is formed in the semiconductor substrate 21. After that, the exposed gate parts are etched in a predetermined depth so that first recesses 23 are formed.

Preferably, the recess mask is a stacked layer consisting of a buffer oxide layer and a polysilicon layer. However, the recess mask can be made from a photoresist film or a material having a high etching selectivity with respect to silicon.

Figure 2B:
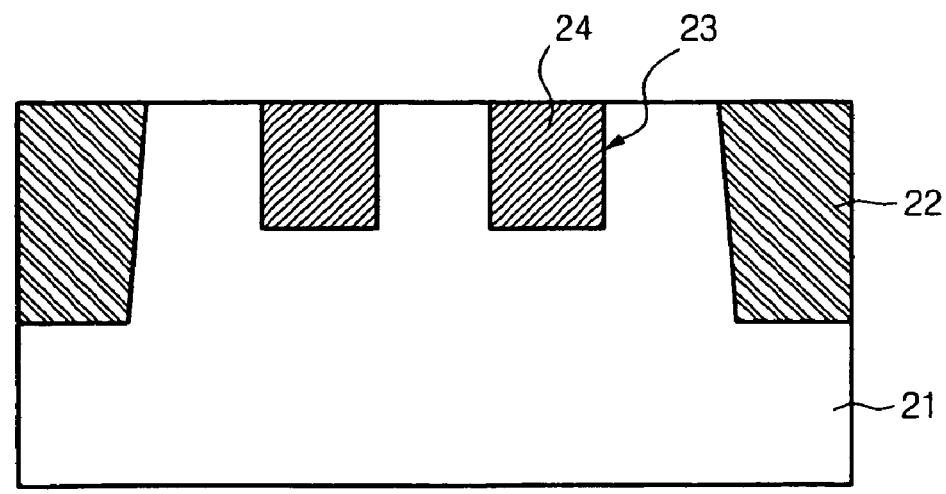

Referring to FIG. 2B, after removing the recess mask, a gate conductive layer, preferably, a polysilicon layer 24 is deposited on an entire surface of the semiconductor substrate 21 including the isolation layer 22 such that the first recesses 23 are filled with the polysilicon layer 24. After that, the polysilicon layer 24 is subject to the etch-back process or the CMP (chemical mechanical polishing) process until the surface of the semiconductor substrate 21 is exposed.

Figure 2C:
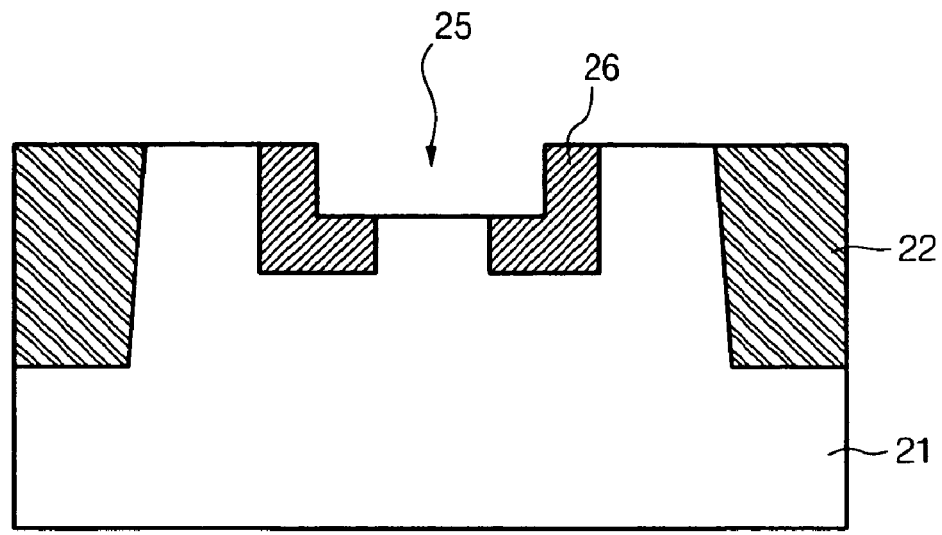

Referring to FIG. 2C, a predetermined part of the active area of the semiconductor substrate, where a drain area is formed later, and a predetermined portion of the polysilicon layer 24 filled in the first recesses 23 are etched by a predetermined depth, thereby forming a second recess 25. In addition, under stepped gates 26 having "⌊" and "⌋" shapes are formed over both sidewalls of the second recess 25, an upper surface of the semiconductor substrate adjacent to the second recess 25 and a predetermined inner portion of the semiconductor substrate formed below the upper surface of the semiconductor substrate.

According to the present invention, although the gates 26 have stepped structures to increase a channel length, since the gates 26 are formed in the semiconductor substrate 21 with the under stepped structures, the under stepped gates 26 may not lean. Therefore, the present invention does not cause the "LPC not open fail" in the following LCP process.

Figure 2D:
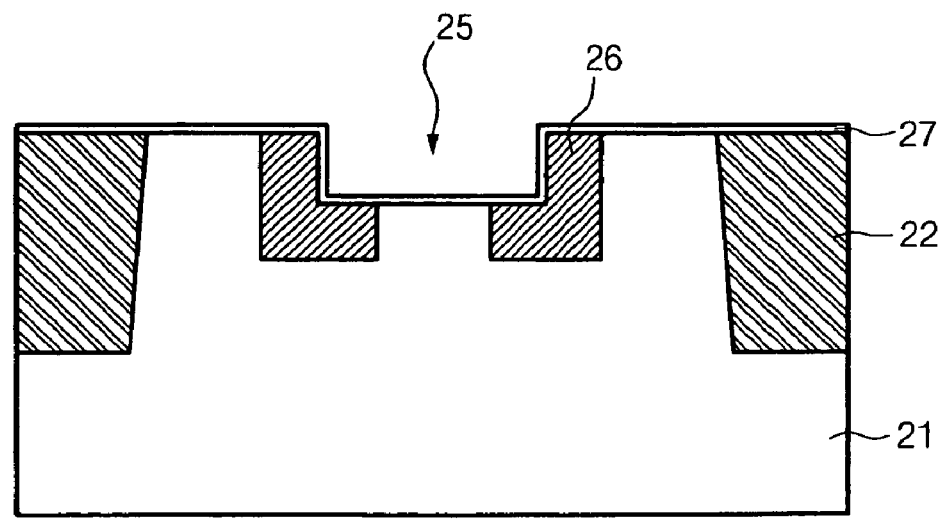

Referring to FIG. 2D, a gate oxide process is performed with respect to the resultant substrate, thereby forming a gate oxide layer 27 on an upper surface of the semiconductor substrate 21 including the under stepped gates 26. The gate oxide layer can be formed through a deposition process, instead of the gate oxide process. In addition, not only a silicon oxide layer, but also an oxide layer having a high dielectric constant can be used as an oxide material. Although the oxide layer is preferably used for a gate insulating layer, a nitride layer or a stacked layer consisting of an oxide layer and a nitride layer can be used instead of the oxide layer.

Figure 2E:
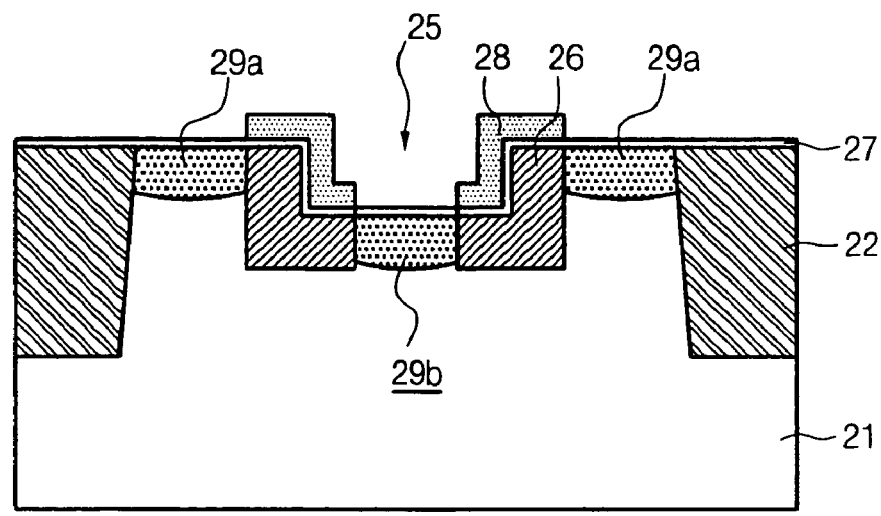

Referring to FIG. 2E, a silicon epitaxial layer is formed on the gate oxide layer 27 through a selective epitaxial growing process. After that, a channel layer 28 is formed on the gate oxide layer provided on an upper portion of the under stepped gates 26 by etching the silicon epitaxial layer. When the silicon epitaxial layer has been etched to form the channel layer 28, the gate oxide layer preferably remains at both sides of the under stepped gates 26.

After that, a source/drain ion implantation process is performed with respect to the resultant substrate by using the remaining gate oxide layer as a buffer layer, thereby forming a source area 29a and a drain area 29b on the surface of the active area of the semiconductor substrate formed at both sides of the under stepped gates 26.

Figure 2F:
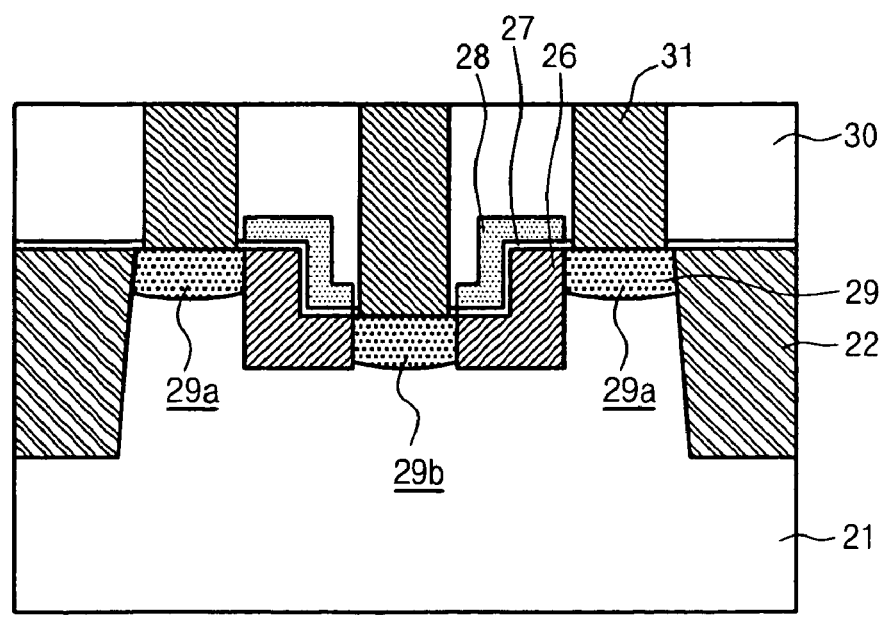

Referring to FIG. 2F, an interlayer insulating film 30 including a nitride layer is formed on the resultant substrate. After that, the interlayer insulating film 30 and the remaining gate oxide layer 27 are etched through the LPC process, thereby forming contact holes for exposing the source and drain areas 29a and 29b. In addition, a conductive layer, for instance, a polysilicon layer is filled in the contact holes, thereby forming a landing plug 31.

As mentioned above, according to the present invention, the gates 26 have under stepped structures so that the gates 26 may not lean. Thus, the "LPC not open fail" may not occur when forming the contact holes, that is, when forming the LPC. Therefore, according to the present invention, the landing plug 31 can be stably formed.

After that, although it is not illustrated, processes generally known in the art are sequentially performed in order to fabricate the semiconductor device according to the present invention.

As described above, the semiconductor device according to the present invention includes gates having under stepped structures so that the leaning of the gates may not occur. Thus, it is possible to prevent the "LPC not open fail" in the following LPC process. Accordingly, the present invention can improve the process reliability and can obtain the highly integrated semiconductor memory device having desired device characteristics.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A semiconductor device comprising:
    a semiconductor substrate having a recess having a sidewall and a bottom surface in an active area of the semiconductor substrate, wherein the recess bottom surface is lower than the surface of the semiconductor substrate outside the recess;
    a source area formed in a portion of the semiconductor substrate outside the recess;
    a drain area formed in a portion of the semiconductor substrate below the recess bottom surface; and
    an understepped gate formed in a portion of the semiconductor substrate along at least the recess sidewall, wherein the understepped gate electrically connects the source area and the drain area.

2. The semiconductor device of claim 1, wherein the active area of the semiconductor substrate is formed between two areas of isolation layers in the semiconductor substrate.

3. The semiconductor device of claim 2, further comprising a gate insulating layer formed at least on one of the two areas of the isolation layers in the semiconductor substrate.

4. The semiconductor device of claim 3, further comprising an interlayer insulating film formed at least on the gate insulating layer formed at least on one of the two areas of the isolation layers in the semiconductor substrate.

5. The semiconductor device of claim 1, further comprising a gate insulating layer formed at least on the understepped gate.

6. The semiconductor device of claim 5, further comprising a channel layer formed on the gate insulating layer formed on the understepped gate.

7. The semiconductor device of claim 6, wherein the channel layer includes a silicon epitaxial layer.

8. The semiconductor device of claim 6, further comprising a plurality of landing plugs, each of which is electrically contacting either a source area or a drain area.

9. The semiconductor device of claim 8, further comprising a interlayer insulating film formed in between two landing plugs and above the channel layer formed on the gate insulating layer formed on the understepped gate.

10. A method of manufacturing a semiconductor device having a semiconductor substrate having an active area defined by two areas of isolation layer formed in the semiconductor substrate, the method comprising steps of:

etching at least two predetermined parts of the active area to a first depth forming first recesses;

filling a conductive layer in each of the first recesses;

etching the active area between two conductive layers of the first recesses and a portion of each conductive layer adjoining the etched active area to a second depth forming a second recess having a sidewall and a bottom surface, wherein the second depth of the second recess is shallower than the first depth of the first recess, and wherein the two etched conductive layers formed at least along the second recess side wall are understepped gates;

forming a source area in a portion of the semiconductor substrate outside the second recess, wherein the source area is in electrical contact with the understepped gate; and forming a drain area in a portion of the semiconductor substrate below the second recess bottom surface, wherein the drain area is in electrical contact with the understepped gate.

11. The method of claim 10, wherein the conductive layer includes a polysilicon layer.

12. The method of claim 10, further comprising forming a gate insulating layer at least on the understepped gate.

13. The method of claim 12, further comprising forming a channel layer at least on the gate insulating layer formed on the understepped gate.

14. The method of claim 13, wherein the step of forming the channel layer includes the substeps of:

growing a silicon epitaxial layer on the gate insulating layer through a selective epitaxial growing process; and etching the silicon epitaxial layer.

15. The method of claim 14, wherein the gate insulating layer remains on each of the source and drain areas even after the silicon epitaxial layer has been etched.

16. The method of claim 15, wherein the gate insulating layer remaining on the source/drain areas is used as a buffer layer when an ion implantation process is performed to form the source/drain areas.

17. The method of claim 16, further comprising forming a plurality of landing plugs, each of which is electrically contacting either a source area or a drain area.

18. The method of claim 17, further comprising forming a interlayer insulating film in between two landing plugs and above the channel layer, 19. The method of claim 13, further comprising forming a plurality of landing plugs, each of which is electrically contacting either a source area or a drain area.

20. The method of claim 19, further comprising forming a plurality of landing plugs, each of which is electrically contacting either a source area or a drain area.

* * * * *

UNITED STATES PATENT AND TRADEMARK OFFICE
CERTIFICATE OF CORRECTION

PATENT NO. : 7,268,391 B2  Page 1 of 1
APPLICATION NO. : 11/251700
DATED : September 11, 2007
INVENTOR(S) : Seung Pyo Park It is certified that error appears in the above-identified patent and that said Letters Patent is hereby corrected as shown below:

On the title page after the abstract "20 claims" should read --9 claims--.

Column 5, line 23 through      Delete claims 10-20
Column 6, line 41

Signed and Sealed this

Third Day of June, 2008

JON W. DUDAS
*Director of the United States Patent and Trademark Office*